United States Patent
Yu et al.

(10) Patent No.: US 6,277,700 B1
(45) Date of Patent: Aug. 21, 2001

(54) HIGH SELECTIVE NITRIDE SPACER ETCH WITH HIGH RATIO OF SPACER WIDTH TO DEPOSITED NITRIDE THICKNESS

(75) Inventors: Jie Yu; Guan Ping Wu; Yelehanka Ramachandramurthy Pradeep, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/480,272

(22) Filed: Jan. 11, 2000

(51) Int. Cl.[7] ................................................. H01L 21/336
(52) U.S. Cl. .................. 438/303; 438/304; 438/595; 438/596
(58) Field of Search ............................... 438/303, 304, 438/595, 596

(56) References Cited

U.S. PATENT DOCUMENTS

| | | | | |
|---|---|---|---|---|
| 4,490,209 | | 12/1984 | Hartman | 156/643 |
| 4,818,715 | | 4/1989 | Chao | 437/44 |
| 5,338,395 | | 8/1994 | Keller et al.1 | 156/643 |
| 5,431,772 | | 7/1995 | Babie et al. | 156/643.1 |
| 5,516,720 | * | 5/1996 | Lur et al. | 438/422 |
| 5,661,049 | * | 8/1997 | Lur et al. | 438/303 |
| 5,668,065 | * | 9/1997 | Lin | 438/303 |
| 5,851,890 | * | 12/1998 | Tsai et al. | 438/303 |
| 5,854,136 | | 12/1998 | Huang et al. | 438/714 |
| 6,004,852 | * | 12/1999 | Yeh et al. | 438/303 |
| 6,013,569 | * | 1/2000 | Lur et al. | 438/595 |
| 6,022,783 | * | 2/2000 | Wu | 438/303 |
| 6,025,267 | * | 2/2000 | Pey et al. | 438/303 |
| 6,069,042 | * | 5/2000 | Chien et al. | 438/595 |
| 6,140,218 | * | 10/2000 | Liu et al. | 438/595 |
| 6,159,804 | * | 12/2000 | Gardner et al. | 438/303 |
| 6,180,501 | * | 1/2001 | Pey et al. | 438/303 |

* cited by examiner

Primary Examiner—John F. NIebling
Assistant Examiner—Lynne A. Gurley
(74) Attorney, Agent, or Firm—George O. Saile; Rosemary L. S. Pike; William J. Stoffel

(57) ABSTRACT

A method of etching silicon nitride spacers beside a gate structure comprising: providing a gate electrode over a gate oxide layer on a substrate. A liner oxide layer is provided over the substrate and the gate electrode. A silicon nitride layer is provided over the liner oxide layer. The invention's nitride etch recipe is performed in a plasma etcher to anisotropically etch the silicon nitride layer to create spacers. The nitride etch recipe comprises a main etch step and an over etch step. The main etch step comprises the following conditions: a $Cl_2$ flow between 35 and 55 molar %, a He flow between 35 and 55 molar %, a backside He pressure between 4 and 10 torr; and a HBr flow between 7.5 and 12.5 molar %; a pressure between 400 to 900 mTorr; at a power between 300 and 600 Watts. The etch recipe provides a spacer width to nitride layer thickness ratio of about 1:1 and does not pit the Si substrate surface.

17 Claims, 1 Drawing Sheet

HIGH SELECTIVE NITRIDE SPACER ETCH WITH HIGH RATIO OF SPACER WIDTH TO DEPOSITED NITRIDE THICKNESS

BACKGROUND OF THE INVENTION

1) Field of the Invention

This invention relates generally to a process for etching silicon nitride (SiN) spacers on sidewalls of gate electrodes of semiconductor devices.

2) Description of the Prior Art

Spacers are widely used in manufacturing as protective structure against subsequent processing steps. In particular, nitride spacers formed beside gate electrodes are used as a mask to protect underlying source/drain areas during doping or implanting steps.

As physical geometry of semiconductor devices shrinks, the gate electrode spacer becomes smaller and smaller. The spacer width is limited by nitride thickness that can be deposited conformably over the dense gate electrodes lines. So the nitride spacers etching process is preferred to have a high ratio of spacer width to nitride layer thickness as deposited (we call this ratio the width to thickness ratio). At the same time high selectivity or nitride to oxide is required to prevent damage on silicon substrate. The conventional F based chemistry gives relatively high selectivity, but low width thickness ratio. The existing Cl based chemistry gives relatively high width to thickness ratio but low selectivity.

The patent of Babie et al. (U.S. Pat. No. 5,431,772, July 1995) described a two-step method of etching silicon nitride film, and was mainly concerned with the problem of possible contamination of the surface of the silicon nitride film by oxygen-containing substances such as silicon dioxide or silicon oxynitride. That invention comprises a first step of removing the surface oxide or oxynitride from the silicon nitride layer in a reactive plasma of fluorine-containing gases consisting essentially of $SF_6$, $CF_4$, $C_2F_6$ and $NF_3$. In the second step, the main etch: step, the silicon nitride layer is etched with a high selectivity with respect to the etching of the silicon dioxide underlayer, using a reactive plasma gas mixture of HBr, or HBr and SiF4, and an oxidant selected from the group consisting of $O_2$, $CO_2$, or $N_2O$ and a diluent gas such as He, N2, or Ar. The optimum process conditions are described to be as follows: HBr flow 20.00 sccm, $O_2$ flow 0.45 sccm, He flow 1.05 sccm, pressure 100 mTorr, power density 1.65 W/cm.sup.2, magnetic field 45 gauss, giving an etch rate of 600 ANG./min. They have mentioned a $Si_3N_4/SiO_2$ etch selectivity of 12.6:1.

Other prior art inventions have also described silicon nitride etch processes with high selectivities with respect to silicon dioxide underlayer.

In the fabrication of all kinds of integrated circuit devices, a high Si3 N4/SiO2 etch selectivity is important for accurately controlling the etch end point and preventing damage to the silicon substrate by over etching the oxide. The enhancement of the $Si_3N_4$/SiO2 etch selectivity is the aim of the prior art inventions mentioned above. However, these prior art inventions have not addressed issues that become very important in the fabrication of submicron devices, and particularly devices that are 0.5 $\mu$m or smaller. A very important issue is the requirement of the ability of the etch process to accurately conform to the critical dimension of these small devices. A very high degree of etch anisotropy is desirable to produce highly vertical sidewalls of the silicon nitride spacer, thereby conforming to the critical dimension from the top to the bottom of the silicon nitride spacer. A low etch anisotropy will produce undesirable sloping sidewalls of the silicon nitride layer, causing deviation from the required critical dimension and a low width to thickness ratio (less than 0.9).

Beside the silicon nitride etch processes described by the aforementioned prior art inventions, traditional nitride etch process currently in use is a two-step process comprising a main step using SF6 and He in the gaseous plasma to get near the end point, and a second step of high $Si_3N_4/SiO_2$ etch selectivity using $SF_6$ and $O_2$ in the gaseous plasma so as to prevent the occurrence of non-uniform patches of unremoved silicon nitride without unduly over-etching the pad oxide underneath the silicon nitride. Thus, the second etch step is an over-etch step for silicon nitride, but is one that will not over etch the pad oxide.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,431,772(Babie et al.) shows a SiN etch using $O_2$/HBr and He.

U.S. Pat. No. 4,818,715(Chao) shows a poly gate stack etch with a SiN layer 42. See Col. 6.

U.S. Pat. No. 5,854,136(Huang et al.) shows a three step etch process with HBr, $SF_6$ and He.

U.S. Pat. No. 5,338,395(Keller et al.) shows another SiN etch process.

SUMMARY OF THE INVENTION

It is an object of the present invention to provide a method to etch silicon nitride (SiN) spacers beside a gate electrode to maintain a good selectivity.

It is an object of the present invention to provide a method to etch SiN spacers beside a gate electrode to maintain a good selectivity and a good spacer width to SiN layer thickness ratio.

It is an object of this invention to provide a new etching process, capable of etching silicon nitride over $SiO_2$ very selectively for products where the semiconductor device structure would have an even thinner $SiO_2$ stopping layer during silicon nitride etching where it is required to assure product manufacturability and acceptable yield capacity in manufacturing.

It is an object of the present invention to provide a method for a SiN spacer etch comprising a chemistry comprising $Cl_2$/He/HBr.

To accomplish the above objectives, the present invention provides a method of etching SiN layers to form spacers, where the etch has a high selectivity (>18:1 (SiN:$SiO_2$) and about 20:1 (SiN to silicon oxide) and will not pit the Si substrate surface. The etch also has a high spacer width to thickness ratio. The main etch step preferably comprises $Cl_2$/He and a low flow of HBr. The etch process employs main etch step with an end point detection and an overetch step that is a percentage of the main etch.

The invention is a method of etching silicon nitride spacers beside a gate structure comprising: providing gate electrode over a gate oxide layer on a substrate; providing a liner oxide layer over the substrate and the gate electrode; providing a silicon nitride layer over the liner oxide layer. The nitride layer is preferably formed by a PECVD, LPCVD or rapid thermal CVD(RTCVD) process.

A nitride etch recipe is performed in a plasma etcher to anisotropically etch the silicon nitride layer to create spacers. The nitride etch recipe comprises a main etch step and an over etch step. The main etch step comprising the following conditions: a $Cl_2$ flow between 35 and 55 molar %, a He flow between 35 and 55 molar %, and a HBr flow between 7.5 and 12.5 molar %; a pressure between 400 to 900 mTorr and a backside cooling He pressure between 4 and 10 torr, and at a power between 300 and 600 Watts. The mole % (molar % flow rates or ratios) above do not include the small He backside cooling flow.

The mixed chemistry etch of the invention provides excellent selectivity to prevent Si Substrate pitting as well as anisotropic etch capability to ensure a good spacer width to SiN layer thickness ratio about 1.

A preferred set of etch conditions for a 4428XL model and LAM research REI etcher) is shown below. Of course these parameters will vary depending on the make and model of the etcher used in the process. The molar % rates or ratios of the gasses will remain the same and the process flow rates can be scaled up or down depending on the etcher and product.

Pressure 400 to 900 mtorr
Power: 300 to 600 Watts
$Cl_2$: 50 to 200 SCCM (Standard cc per minute)
HE 50 to 200 SCCM
HBr 10 to 50 SCCM
He (Backside cooling pressure) 4 to 10 torr Of course these parameters will vary depending on the make and model of the etcher used in the process. The molar ratios of the gasses will remain the same and the process flow rates can be scaled up or down depending on the etcher and product.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Definitions

Figure 1:
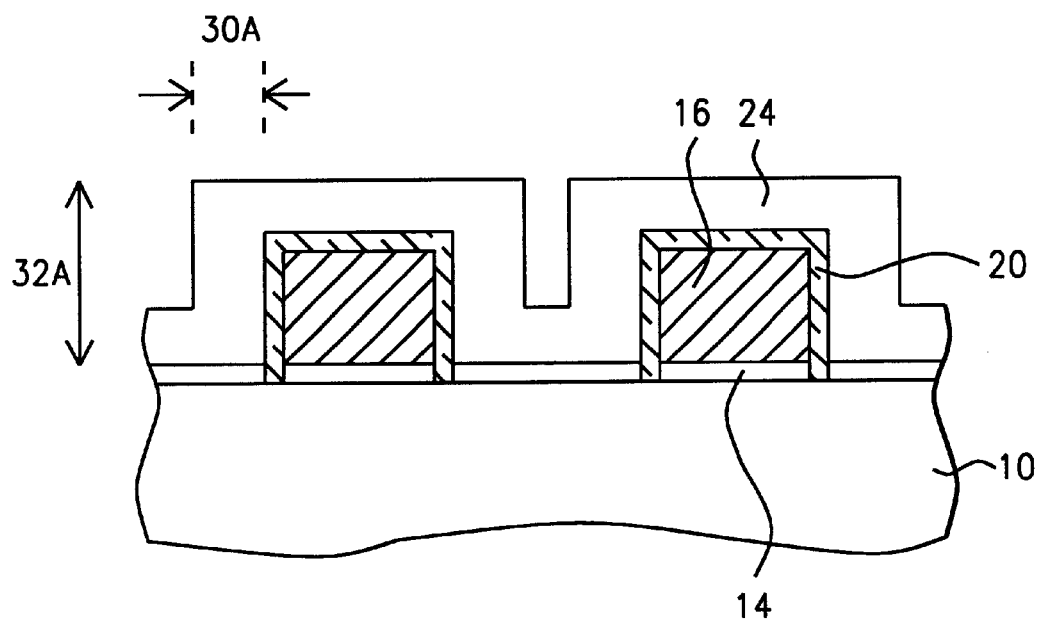
FIG. 1 is cross sectional view of a silicon nitride layer over a gate electrode before the invention's SiN etch for illustrating the method according to the present invention.

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF glow discharge, reference to "the contact material" includes aluminum, aluminum alloys, and other conductive materials which have a melting point enabling them to be sputtered over the temperature range described herein.

Specific terminology of particular importance to the description of the present invention is defined below.

The term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The term "feature" refers to contacts, vias, trenches, and other structures which make up the topography of the substrate surface.

A. Problems with Prior Art Etches
Conventional F-based Chemistry

The inventor's have found that the conventional F-based chemistry (e.g., $SF_6$, NF3, F4, $CHF_3$) gives relatively high selectivity but low width to thickness ratio is less than 0.8 to 1.

For example, a 800 Å nitride layer as deposited yields after a conventional F-base chemistry etch a spacer width <640 Å.

Conventional Cl-based Chemistry

Conventional Cl-based chemistry (E.g., $Cl_2$—He) gives relatively high width to thickness ration but low selectivity. The reason the inventors surmise is that it behaves in more anisotropic etching manner, but gives poorer selectivity in comparison with a F-Based chemistry. The poor selectivity give less margin for over etch which is important to make sure free of nitride resides and a the same time is easy to get pitting (etching) in the Si substrate surface.

B. Invention's SiN Etch Chemistry of Cl/He/HBr

The invention uses a mixed chemistry of $Cl_2$, inert gas (He preferred) and Hydrogen halide (HBr preferred). Other inert gasses in addition to He, such as Ar or $N_2$ can be used. Other Hydrogen halides (in addition to HBr) can be used such as HI. The molar % and flow rates remain the same for all these combinations.

Basically $Cl_2$ behaves in a more anisotropic etching manner which results in high width to thickness ratio. He is a dilute gas to get be better etching uniformity. HBr plays an important role in polymer formation which gives slow oxide etch rate and high selectivity.

C. Process of the Invention

The present invention will be described in detail with reference to the accompanying drawings. The present invention provides a method of etching Nitride spacers.

As shown in FIG. 1, we provide a gate electrode 16 over a gate oxide layer 14 on a substrate 10. The gate electrode has a width between about 1000 and 5000 Å, and a height between about 1300 and 3000 Å. The gate electrode 16 is preferably comprised of polysilicon. The gate electrode of present technology is of 0.18 $\mu$m groundrules and the gate to gate spacing is of 0.26 $\mu$m groundrules.

Next, a liner oxide layer 20 over the substrate 10 and the gate electrode 16. The oxide liner preferably has a thickness of between about 50 and 250 Å. The oxide liner is preferably formed by a TEOS LPCVD or TEOS PECVD process.

SiN Layer 24

A silicon nitride layer 24 is formed over the liner oxide layer 20. The silicon nitride layer is preferably formed by a LPCVD, RTCVD or PECVD process. The invention's etch has slightly different selectivity for LPCVD SIN or PECVD SiN or RTCVD SiN. Selectivity is slightly higher for the PECVD SiN or RTCVD SiN than for the LPCVD SiN.

The silicon nitride layer 24 preferably has a first thickness 30A of between about 600 and 1200 Å; and more preferably between 750 and 850 Å. The height 32A is preferably between 1900 and 4000 Å. However, the exact thickness of the silicon nitride layer is determined by the size of the gate and groundrules of the technology.

The silicon nitride layer 24 preferably has an overall height 32A between 2000 and 4000 Å.

Figure 2:
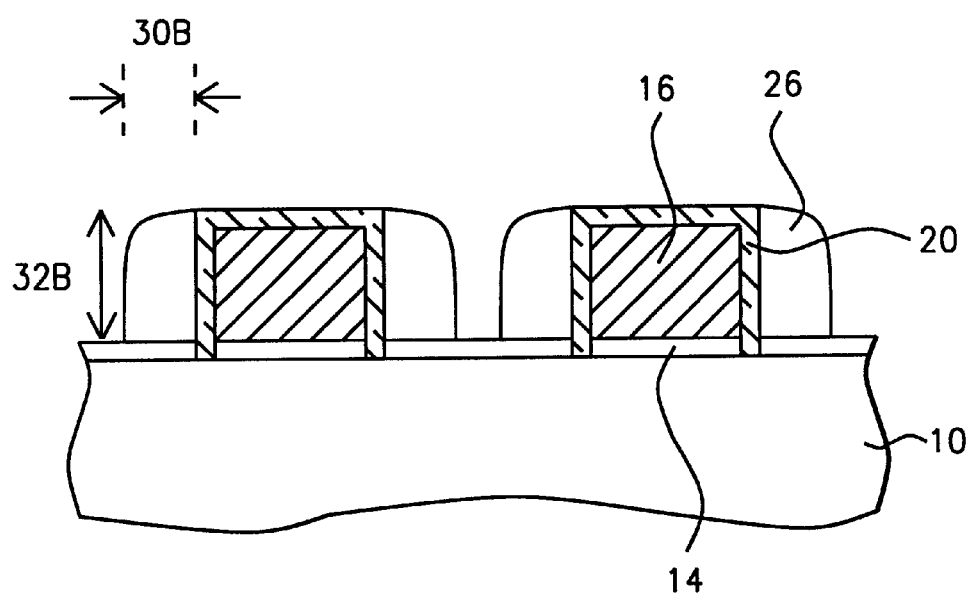
FIG. 2 is cross sectional view of a silicon nitride spacer beside a gate electrode after the invention's SiN etch for illustrating the method according to the present invention.

As shown in FIG. 2, using the invention's etch process we anisotropically etch the silicon nitride layer forming spacers 26 by performing a nitride etch recipe in a plasma etcher. The invention can be carried out in a conventional SiN etcher such as a 4428XL model by LAM Research manufacturer and preferably a RIE etcher.

Main Etch Step

The nitride etch recipe comprises a main etch step and an over etch step.

The main etch step comprising the following conditions:
Pressure between 400 and 900 mtorr;
Power between 300 and 600 Watts;
and gas flows of
$Cl_2$ flow between 50 to 200 SCCM, or 35 to 55 molar %,
He between 50 to 200 SCCM, or 35 to 55 molar %
HBr between 10 to 50 SCCM; or 7.5 to 12.5 molar %;
He backside cooling pressure 4 to 10 torr.

The most preferred main etch step conditions are:
Pressure between 400 and 900 mtorr;
Power between 300 and 600 Watts;
and gas flows of
$Cl_2$ flow between 43 to 47 molar %,
He between 43 to 47 molar %
HBr between 8 to 12 molar %;
He backside cooling pressure 4 to 10 torr.
Note that the mole % (molar flow rates/ratios) above do not include the small He back side cooling flow.

Over Etch Step

The over etch step is performed under the same conditions as the main etch step. The main etch step is terminated by an endpoint detection preferably at a 95% of end point as the trigger. The over etch step is performed for a percentage between 15% and 30% of the main etch step time. The over etch step ensures that no SiN residue is left behind. The invention's high selectivity ensures that the over etch step will not pit the Si substrate. Note that the mole % (molar flow rates) above do not include the small He back side cooling flow.

The spacers 26 preferably have a width 30B between about 600 and 1200 Å, (more preferably between 750 to 850 Å) and a height 32b between about 1300 and 3000 Å (depending on the height of the gate electrode).

The spacer width 30B to SiN layer 30A thickness ratio is preferably between 0.97:1 and 1.03:1.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of etching silicon nitride spacers beside a gate structure comprising
   a) providing a gate electrode over a gate oxide layer on a substrate; providing a liner oxide layer over said substrate and said gate electrode; providing a silicon nitride layer over said liner oxide layer;
   b) anisotropically etching said silicon nitride layer forming spacers by performing a nitride etch recipe in a plasma etcher; said nitride etch recipe comprising a main etch step and an over etch step;
      (b1) said main etch step comprising the following conditions: a $Cl_2$ flow between 35 and 55 molar %, a He flow between 35 and 55 molar %, and a HBr flow between 7.5 and 12.5 molar %.

2. The method of claim 1 wherein said overetch step comprises the following conditions: a $Cl_2$ flow between 35 and 55 molar %, a He flow between 35 and 55 molar %, and a HBr flow between 7.5 and 12.5 molar %.

3. The method of claim 1 wherein said silicon nitride layer having a first thickness of between about 600 and 1200 Å.

4. The method of claim 1 wherein said gate electrode having a width between about 1000 and 5000 Å, and a height between about 1500 and 3000 Å.

5. The method of claim 1 wherein said oxide liner has a thickness of between about 50 and 250 Å.

6. The method of claim 1 wherein the main etch step further comprises the following conditions: a pressure between 400 to 900 mTorr and a backside He cooling pressure between 4 and 10 torr; and at a power between 300 and 600 Watts.

7. The method of claim 1 wherein said nitride etch recipe having a selectivity between silicon nitride and silicon oxide between 18:1 and 25:1.

8. The method of claim 1 wherein said spacers have a width between about 600 and 1200 Å, and a height between about 1300 and 2800 Å.

9. The method of claim 1 wherein said nitride etch recipe comprises said main etch step and an over etch step; said over etch step time is between 15 and 30% as long as said main etch step time.

10. The method of claim 1 wherein said nitride etch recipe comprises reactor conditions of: a Pressure between 400 and 900 mtorr; power between 300 and 600 Watts; and gas flows of $Cl_2$ between 50 to 200 SCCM (Standard cc per minute), He between 50 to 200 SCCM; HBr between 10 to 50 SCCM; Backside He cooling pressure 4 to 10 torr.

11. A method of etching silicon nitride spacers beside a gate structure comprising:
   a) providing a gate electrode over a gate oxide layer on a substrate; providing a liner oxide layer over said substrate and said gate electrode; providing a silicon nitride layer over said liner oxide layer;
      (1) said silicon nitride layer having a first thickness of between about 600 and 1200 Å;
   b) anisotropically etching said silicon nitride layer forming spacers by performing a nitride etch recipe in a plasma etcher; said nitride etch recipe comprising a main etch step and an over etch step; said main etch step comprising the following conditions: a $Cl_2$ flow between 35 and 55 molar %, a He flow between 35 and 55 molar %, and a HBr flow between 7.5 and 12.5 molar %; a pressure between 400 to 900 mTorr and a backside He cooling pressure between 4 and 10 torr; at a power between 300 and 600 Watts;
  (1) said nitride etch recipe having a selectivity between silicon nitride and silicon oxide between 18:1 and 25:1;
  (2) said spacers have a width between about 600 and 1200 Å, and a height between about 1300 and 2800 Å.

12. The method of claim 11 wherein said gate electrode having a width between about 1000 and 5000 Å, and a height between about 1500 and 3000 Å.

13. The method of claim 11 wherein said oxide liner having a thickness of between about 50 and 250 Å.

14. The method of claim 11 wherein said nitride etch recipe comprises said main etch step and an over etch step; said over etch step is between 15 and 30% as long as said main etch step.

15. The method of claim 11 wherein said nitride etch recipe comprises reactor conditions of: gas flows of $Cl_2$ between 50 to 200 SCCM (Standard cc per minute), He between 50 to 200 SCCM; HBr between 10 to 50 SCCM; and a backside He cooling pressure 4 to 10 pressure.

16. A method of etching silicon nitride spacers beside a gate structure comprising:
  a) providing a gate electrode over a gate oxide layer on a substrate; providing a liner oxide layer over said substrate and said gate electrode; providing a silicon nitride layer over said liner oxide layer;
    (1) said silicon nitride layer having a first thickness of between about 600 and 1200 Å;
    (2) said gate electrode having a width between about 1000 and 5000 Å, and a height between about 1500 and 3000 Å;
    (3) said oxide liner having a thickness of between about 50 and 250 Å;
  b) anisotropically etching said silicon nitride layer forming spacers by performing a nitride etch recipe in a plasma etcher; said nitride etch recipe comprising a main etch step and an over etch step; said main etch step comprising the following conditions: pressure between 400 and 900 mtorr; power between 300 and 600 Watts; and gas flows of $Cl_2$, between 50 to 200 SCCM, between 35 and 55 molar %, He between 50 to 200 SCCM, between 35 and 55 molar %; HBr between 10 to 50 SCCM; between 7.5 and 12.5 molar %; backside He cooling pressure between 4 and 10 torr,
    (1) said nitride etch recipe having a selectivity between silicon nitride and silicon oxide between 18:1 and 25:1;
    (2) said spacers have a width between about 600 and 1200 Å, and a height between about 1300 and 2800 Å.

17. The method of claim 16 wherein said nitride etch recipe comprises said main etch step and an over etch step; said over etch step is between 15 and 30% as long as said main etch step.

* * * * *